US010963015B2

(12) United States Patent
Sen et al.

(10) Patent No.: US 10,963,015 B2
(45) Date of Patent: Mar. 30, 2021

(54) HYBRID KEYBOARD

(71) Applicant: Intel Corporation, Santa Clara, CA (US)

(72) Inventors: Arnab Sen, Bangalore (IN); Bijendra Singh, Bangalore (IN)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/728,632

(22) Filed: Dec. 27, 2019

(65) Prior Publication Data

US 2020/0142452 A1 May 7, 2020

(51) Int. Cl.
*G06F 1/16* (2006.01)
*G06F 1/20* (2006.01)
*H05K 7/20* (2006.01)
*H01H 9/52* (2006.01)
*H01H 13/88* (2006.01)
*H01H 13/70* (2006.01)

(52) U.S. Cl.
CPC .......... *G06F 1/1662* (2013.01); *G06F 1/1616* (2013.01); *G06F 1/203* (2013.01); *H01H 9/52* (2013.01); *H01H 13/7006* (2013.01); *H01H 13/88* (2013.01); *H05K 7/20336* (2013.01); *G06F 2200/201* (2013.01); *H01H 2009/523* (2013.01); *H01H 2231/002* (2013.01)

(58) Field of Classification Search
CPC ..... G06F 1/1662; G06F 1/1669; H01L 23/427
USPC .......................... 361/679.08, 679.09, 679.47
See application file for complete search history.

(56) References Cited

U.S. PATENT DOCUMENTS

| 6,125,035 A * | 9/2000 | Hood, III ................ G06F 1/203 361/679.47 |
| 2014/0192468 A1* | 7/2014 | Kotaka ................ H05K 5/0004 361/679.08 |
| 2018/0217433 A1* | 8/2018 | Tang ..................... G02F 1/1333 |
| 2019/0037725 A1* | 1/2019 | Uchino .................... H05K 5/03 |

* cited by examiner

*Primary Examiner* — Anthony Q Edwards
(74) *Attorney, Agent, or Firm* — Patent Capital Group

(57) ABSTRACT

Particular embodiments described herein provide for an electronic device that includes a hybrid keyboard. The keyboard can include a first portion of keys with a first key travel and a second portion of keys with a second key travel. The second key travel is less than the first key travel and a support plate can be raised under the second portion of keys and cause the second portion of keys to have the second key travel. In an example, a heat pipe or some other component can be located under the raised support plate and second portion of keys with the second key travel.

20 Claims, 8 Drawing Sheets

US 10,963,015 B2

HYBRID KEYBOARD

TECHNICAL FIELD

This disclosure relates in general to the field of computing and/or device cooling, and more particularly, to a hybrid keyboard design.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems, especially for thin profile devices.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
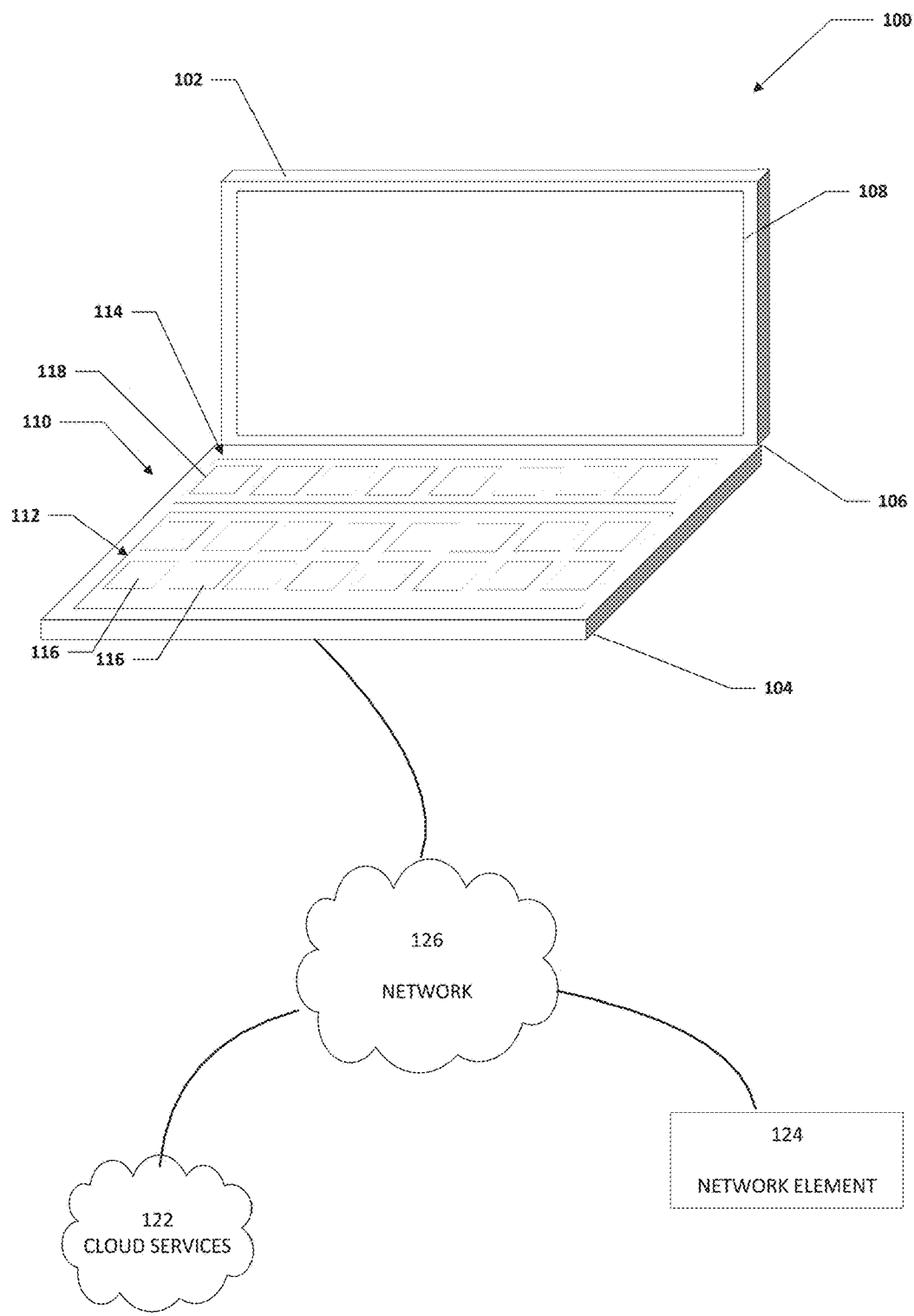
FIG. 1 is a simplified block diagram of a system that includes a hybrid keyboard, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling includes a hybrid keyboard design. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

Implementations of the embodiments disclosed herein may be on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

The term "coupled with," along with its derivatives, may be used herein. The term "coupled" may mean one or more of the following. The term "coupled" may mean that two or more elements are in direct physical, thermal, or electrical contact. However, the term "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Turning to FIG. 1, FIG. 1 is a simplified block diagram of an electronic device 100 configured with a hybrid keyboard design, in accordance with an embodiment of the present disclosure. In an example, electronic device 100 can include a first housing 102 and a second housing 104. First housing 102 can be rotatably coupled to second housing 104 using a hinge 106. First housing 102 can include a display 108.

Second housing 104 can include a keyboard 110. Keyboard 110 can include a first portion of keys 112 and a second portion of keys 114. First portion of keys 112 can include a plurality of first keys 116. Each of plurality of first keys 116 can be a mechanical key that has a first key travel. Second portion of keys 114 can include a plurality of second keys 118. Each of plurality of second keys 118 can include keys that have a second key travel, where the second key travel is less than the first key travel. For example, each of plurality of second keys 118 may be low travel keys, touch keys, or some other type of key that has a relatively low key travel. The lower key travel of second keys 118 as compared to first keys 116 can help to increase the "Z" height under second portion of keys 114 and help to accommodate components, elements, etc. that would not be able to be accommodated under first portion of keys 112. In a specific example, because of the increased Z height under second portion of keys 114, a heat pipe under second portion of keys 114 can be thicker than a heat pipe under first portion of keys 112. The term "Z stack height," "Z height," "Z location," etc. refers to the height along the "Z" axis of an (x, y, z) coordinate axis or cartesian coordinate system.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems, especially for thin profile form factor devices.

For example, in some devices, it can be difficult to cool one or more heat sources, especially when the heat sources are located inside a relatively crowded housing that includes memory, processors, battery, etc. The relatively crowded housing can make it difficult to locate thermal solutions inside the crowded housing. Traditional passive cooling systems have separate thermal solution elements above the heat sources. The common thermal hardware in forced-air cooled laptops is a heat pipe with an attached cold plate on top of a heat source and fins that create an air-cooled heat sink.

Because even curved heat pipes must generally stay in one plane, the "Z" location (thickness dimension) of the heat sink is dictated by the height of the top of the package of the heat source being cooled. As a result, the fin height often must be limited and/or the system design may require a thicker laptop to accommodate the heat sink, especially if the heat sink includes fins. In addition, as microprocessor power increases, the heat pipe assembly must become larger and thicker to accommodate the heat generated from the microprocessor and the larger and thicker heat pipe consumes more volume in the laptop. This can require thicker laptops, which is undesirable from a user perspective. Also, even a rather thick cold plate may not have enough thermal capacitance to enable sufficient duration of high power operation such as opportunistic overclocking. What is needed is a hybrid keyboard design that can help to enable a relatively thin chassis. It would be beneficial if the hybrid keyboard design could accommodate additional cooling capabilities for a thermal system.

A system to enable a hybrid keyboard design, as outlined in FIG. 1, can resolve these issues (and others). In an example, one or more heat pipes over a heatsink and along the function and number keys (top key row) can be thickened to help allow for improved thermal performance. However, current keyboard designs are unable to accommodate the thicker one or more heat pipes. More specifically, due to the thicker one or more heat pipes, compressed current keyboard designs in the closed lid condition would put the silicone domes beneath the keys under constant state of compression, exerting undue stress on the silicon dome of the key. This is likely to affect spring properties and reliability of the silicon dome of the keys.

In an example, to accommodate the thicker one or more heat pipes, the Z-stack height of the keyboard can be reduced in one or more regions that include lesser used keys (e.g., function keys, number keys, etc.). In a specific example, the system can include touch-based keys in the selective regions that include the thicker one or more heat pipes without affecting the key stroke length. In another specific example, lesser used keys may have a lower key travel. Because of the lower key travel, the area under the keys with the lower key travel can have a Z height higher than the area under the keys with the higher key travel. This can help to accommodate an additional heat pipe or a thicker heat pipe under the less used keys with the lower key travel.

In an example implementation, electronic device 100, is meant to encompass a computer, a personal digital assistant (PDA), a laptop or electronic notebook, a clamshell computer, a cellular telephone, network elements, network appliances, or any other device, component, element, or object that includes a heat source and keys that have a key travel where the key travel under one or more keys can be reduced. Electronic device 100 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100 may include virtual elements.

In regards to the internal structure, electronic devices 100 can include memory elements for storing information to be used in operations. Electronic device 100 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations described herein. This includes the memory elements being able to store software, logic, code, or processor instructions that are executed to carry out activities or operations.

Additionally, electronic device 100 can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2:
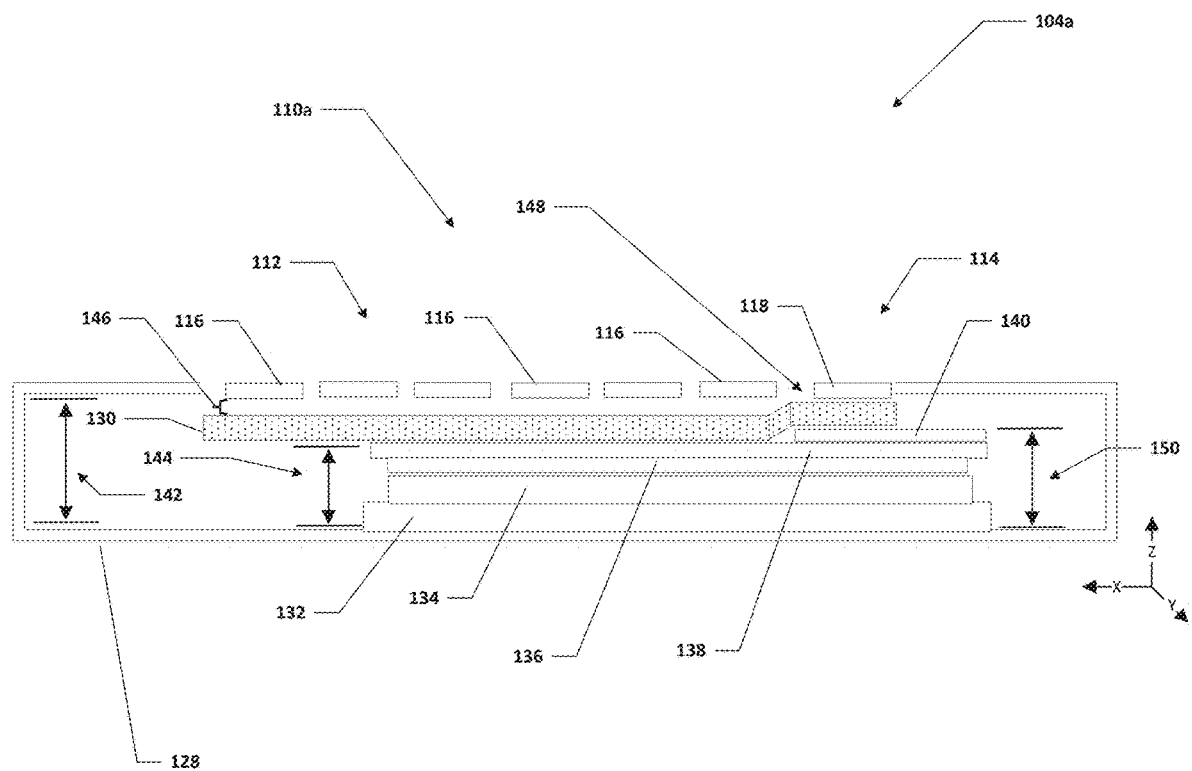
FIG. 2 is a simplified block diagram of a partial view of a system that includes a hybrid keyboard, in accordance with an embodiment of the present disclosure.

Turning to FIG. 2, FIG. 2 is a simplified block diagram of a cut-away side view of second housing 104a. Second housing 104a can include keyboard 110a and a chassis 128. Keyboard 110a can include first portion of keys 112 and second portion of keys 114. First portion of keys 112 can include plurality of first keys 116. Each of plurality of first keys 116 can be a mechanical key that has a first key travel 146. Second portion of keys 114 can include plurality of second keys 118. Each of plurality of second keys 118 can be keys that have a shortened key travel 148, where shortened key travel 148 is less than first key travel 146. For example, each of plurality of second keys 118 may be low travel keys, touch keys, or some other type of key that has a relatively low key travel.

Chassis 128 can include a support plate 130, printed circuit board (PCB) 132, heat source 134, thermal interface 136, a first heat pipe 138, and a second heat pipe 140. Support plate 130 is a plate or layer that includes switches, electronics, and support for the keys in keyboard 110a. Heat source 134 may be a heat generating device (e.g., processor, logic unit, field programmable gate array (FPGA), chip set, integrated circuit (IC), a graphics processor, graphics card, battery, memory, or some other type of heat generating device). First heat pipe 138 and second heat pipe 140 may each be a vapor chamber heat pipe, oscillating heat pipe, pulsating heat pipe, or some other type of heat transfer device that can transfer heat away heat source 134 to a thermal cooling device. Thermal interface 136 may be a thermal interface material (TIM), a cold plate, a copper spreader, or some other thermal interface that can help transfer heat from heat source 134 to first heat pipe 138.

Chassis 128 can be configured to provide an outer shell and protection for second housing 104a. Chassis 128 also defines an interior space or cavity where components of second housing 104a are located. The interior space of chassis 128 can have a limited interior chassis Z height 142. Components inside of chassis 128 must not be higher than interior chassis Z height 142. For example, PCB 132, heat source 134, thermal interface 136, and first heat pipe 138 may have a component height of 144. Component height 144 limits the Z height of a component stack as space needs to be left for support plate 130 and a user-friendly first key travel 146 for first keys 116. The amount of first key travel 146 is important for the user's experience and if first key travel 146 is too short, the user's experience can be negatively affected.

If an additional component or components need to be added to PCB 132, heat source 134, thermal interface 136, and first heat pipe 138, component height 144 needs to be increased. However, component height 144 is limited by interior chassis Z height 142. In an example, support plate 130 can be bent or curved to accommodate the additional component. For example, as illustrated in FIG. 2, support plate 130 is bent to accommodate second heat pipe 140. However, this can decrease the key travel to a shortened key travel 148. Second key 118 can be a modified key to accommodate shortened key travel 148 and allow PCB 132, heat source 134, thermal interface 136, first heat pipe 138, and second heat pipe 140 to have an extended component height 150. While user experience may be impacted by shortened key travel 148, second key 118 with shortened key travel 148 may be a seldom used key or keys so the overall user experience is not greatly impacted. For example, second key 118 may be a function key, number key, or some other type of key that is not frequently used by users.

Figure 3:
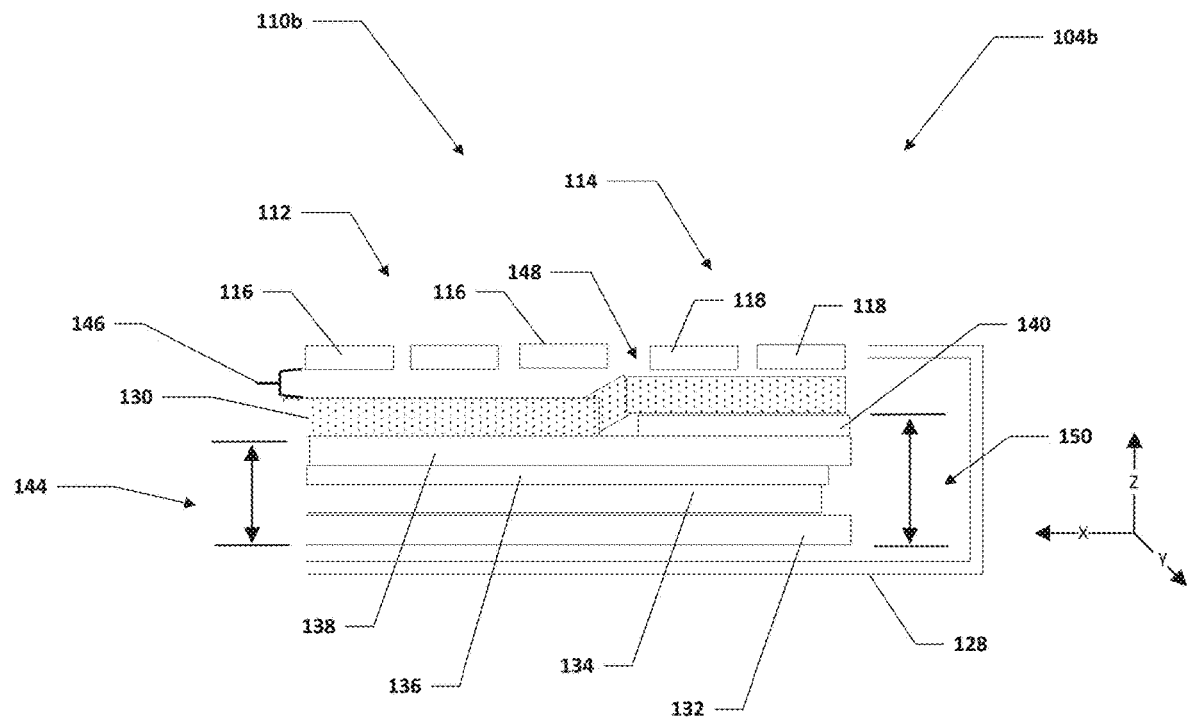
FIG. 3 is a simplified block diagram of a partial view of a system that includes a hybrid keyboard, in accordance with an embodiment of the present disclosure.

Turning to FIG. 3, FIG. 3 is a simplified block diagram of a cut-away side view of a portion of second housing 104b. Second housing 104b can include keyboard 110b and chassis 128. Keyboard 110b can include first portion of keys 112 and second portion of keys 114. First portion of keys 112 can include plurality of first keys 116. Each of plurality of first keys 116 can be a mechanical key that has a first key travel 146. Second portion of keys 114 can include plurality of second keys 118. Each of plurality of second keys 118 can be keys that have a shortened key travel 148, where shortened key travel 148 is less than first key travel 146. For example, each of plurality of second keys 118 may be low travel keys, touch keys, or some other type of key that has a relatively low key travel.

Chassis 128 can include support plate 130, PCB 132, heat source 134, thermal interface 136, first heat pipe 138, and second heat pipe 140. Support plate 130 is a plate or layer that includes switches, electronics, and support for the keys in keyboard 110b. Heat source 134 may be a heat generating device (e.g., processor, logic unit, field programmable gate array (FPGA), chip set, IC, a graphics processor, graphics card, battery, memory, or some other type of each and second heat pipe 140 may be a vapor chamber heat pipe, oscillating heat pipe, pulsating heat pipe, or some other type of heat transfer device that can transfer heat away heat source 134 to a thermal cooling device or cooling system. Thermal interface 136 may be a thermal interface material (TIM), a cold plate, a copper spreader, or some other thermal interface that can help transfer heat from heat source 134 to first heat pipe 138 and second heat pipe 140.

Chassis 128 can be configured to provide an outer shell and protection for second housing 104b. Chassis 128 also defines an interior space or cavity where components of second housing 104b are located. If an additional component or components need to be added to PCB 132, heat source 134, thermal interface 136, and first heat pipe 138, component height 144 needs to be increased. In an example, support plate 130 can be bent or curved to accommodate the additional component or components. For example, as illustrated in FIG. 3, support plate 130 is bent to accommodate second heat pipe 140. However, this can decrease the key travel to shortened key travel 148. Second keys 118 can be a modified key to accommodate shortened key travel 148 and allow PCB 132, heat source 134, thermal interface 136, first heat pipe 138, and second heat pipe 140 to have an extended component height 150. While user experience may be impacted by shortened key travel 148, second keys 118 with shortened key travel 148 may be a seldom used key or keys so the overall user experience is not greatly impacted. For example, second keys 118 may be a function key, number key, or some other type of key that is not frequently used by users. As illustrated in FIG. 3, keyboard 110b can include two rows of second keys 118 with shortened key travel 148. The two rows of second keys 118 with shortened key travel 148 can affect a user's typing experience more than one row of second keys 118 with shortened key travel 148 and the user's typing experience should be taken into account with designing a keyboard with one or more rows of second keys 118 with shortened key travel 148.

Figure 4:
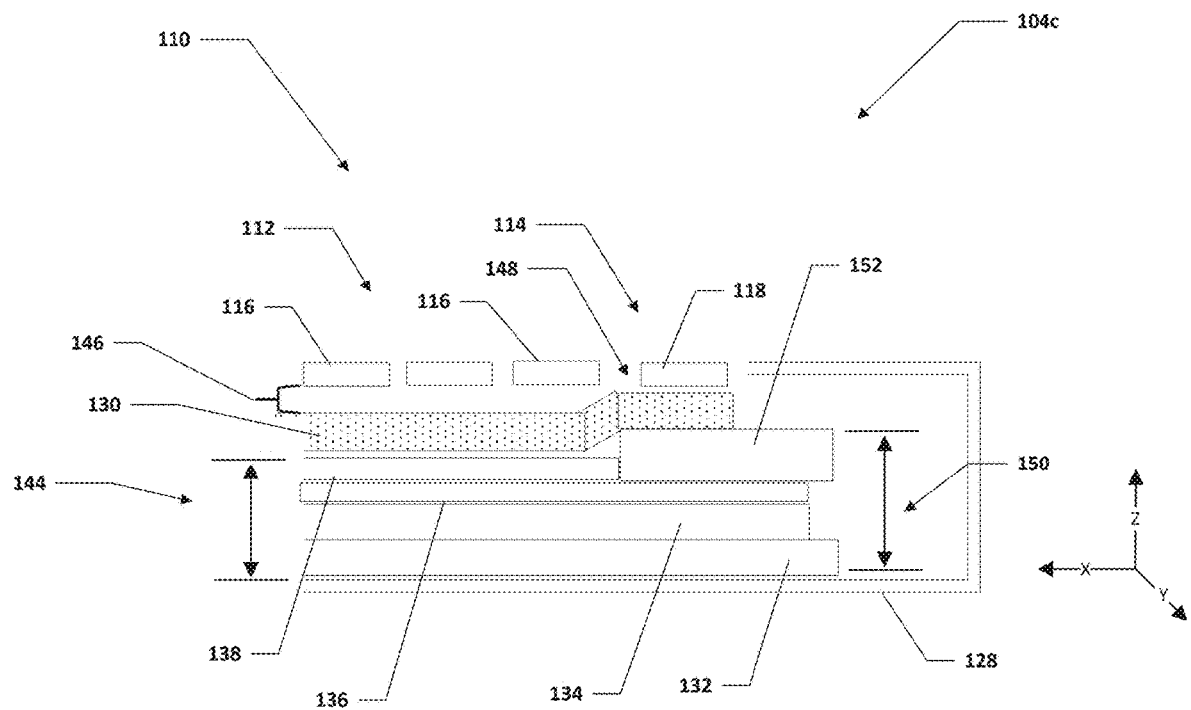
FIG. 4 is a simplified block diagram of a partial view of a system that includes a hybrid keyboard, in accordance with an embodiment of the present disclosure.

Turning to FIG. 4, FIG. 4 is a simplified block diagram of a cut-away side view of a portion of second housing 104c. Second housing 104c can include keyboard 110 and chassis 128. Keyboard 110 can include first portion of keys 112 and second portion of keys 114. First portion of keys 112 can include plurality of first keys 116. Each of plurality of first keys 116 can be a mechanical key that has a first key travel 146. Second portion of keys 114 can include plurality of second keys 118. Each of plurality of second keys 118 can be keys that have a shortened key travel 148, where shortened key travel 148 is less than first key travel 146. For example, each of plurality of second keys 118 may be low travel keys, touch keys, or some other type of key that has a relatively low key travel.

Chassis 128 can include support plate 130, PCB 132, heat source 134, thermal interface 136, first heat pipe 138, and third heat pipe 152. Support plate 130 is a plate or layer that includes switches, electronics, and support for the keys in keyboard 110b. Heat source 134 may be a heat generating device (e.g., processor, logic unit, field programmable gate array (FPGA), chip set, IC, a graphics processor, graphics card, battery, memory, or some other type of heat generating device). Third heat pipe 152 may be a relatively large thickness and/or diameter heat pipe. Third heat pipe 152 may be a vapor chamber heat pipe, oscillating heat pipe, pulsating heat pipe, or some other type of heat transfer device that can transfer heat away heat source 134 to a thermal cooling device. Thermal interface 136 may be a thermal interface material (TIM), a cold plate, a copper spreader, or some other thermal interface that can help transfer heat from heat source 134 to first heat pipe 138 and second heat pipe 140.

Chassis 128 can be configured to provide an outer shell and protection for second housing 104c. Chassis 128 also defines an interior space or cavity where components of second housing 104c are located. The interior space of chassis 128 can have a limited interior chassis Z height 142. If an additional component needs to be added to PCB 132, heat source 134, thermal interface 136, or a larger heat pipe is necessary, component height 144 needs to be increased. In an example, support plate 130 can be bent or curved to accommodate the additional component. For example, as illustrated in FIG. 4, support plate 130 is bent to accommodate the relatively larger thickness and/or diameter third heat pipe 152. However, this can decrease the key travel to shortened key travel 148. Second key 118 can be a modified key to accommodate shortened key travel 148 and allow PCB 132, heat source 134, thermal interface 136, and third heat pipe 152 to have an extended component height 150. While user experience may be impacted by shortened key travel 148, second key 118 with shortened key travel 148 may be a seldom used key or keys so the overall user experience is not greatly impacted. For example, second key 118 may be a function key, number key, or some other type of key that is not frequently used by users.

Figure 5:
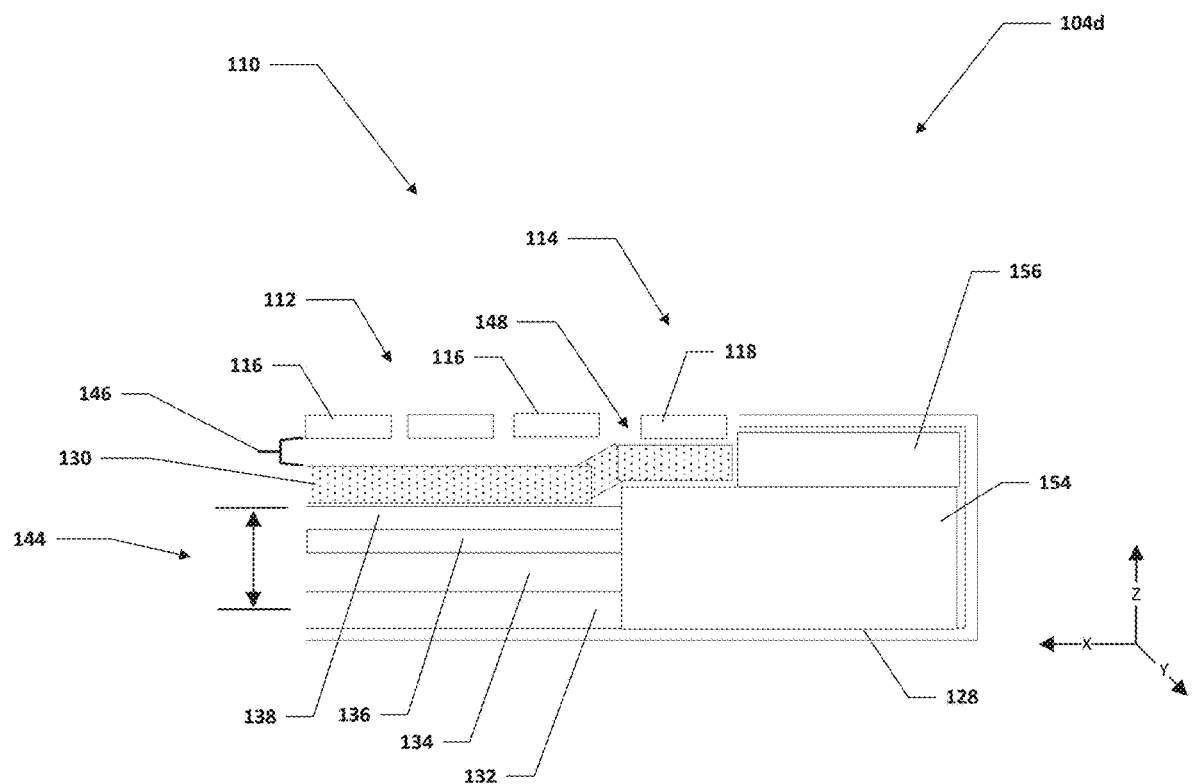
FIG. 5 is a simplified block diagram of a partial view of a system that includes a hybrid keyboard, in accordance with an embodiment of the present disclosure.

Turning to FIG. 5, FIG. 5 is a simplified block diagram of a cut-away side view of a portion of second housing 104d. Second housing 104d can include keyboard 110 and chassis 128. Keyboard 110 can include first portion of keys 112 and second portion of keys 114. First portion of keys 112 can include plurality of first keys 116. Each of plurality of first keys 116 can be a mechanical key that has a first key travel 146. Second portion of keys 114 can include plurality of second keys 118. Each of plurality of second keys 118 can be keys that have a shortened key travel 148, where shortened key travel 148 is less than first key travel 146. For example, each of plurality of second keys 118 may be low travel keys, touch keys, or some other type of key that has a relatively low key travel.

Chassis 128 can include support plate 130, PCB 132, heat source 134, thermal interface 136, first heat pipe 138, thermal cooling device 154, and fan 156. Thermal cooling device 154 may be a passive cooling device or an active cooling device to help reduce the thermal energy or temperature of one or more heat sources. In an example, thermal cooling device can use fan 156 to draw air into second housing 104d though one or more inlet vents in second housing 104d and use the air to help dissipate the heat collected by first heat pipe 138 and thermal cooling device 154.

Chassis 128 can be configured to provide an outer shell and protection for second housing 104d. Chassis 128 also defines an interior space or cavity where components of second housing 104c are located. The interior space of chassis 128 can have a limited interior chassis Z height 142. In an example, support plate 130 can be bent or curved to accommodate the additional height of one or more components. For example, as illustrated in FIG. 5, support plate 130 is bent to accommodate thermal cooling device 154. However, this can decrease the key travel to a shortened key travel 148. Second key 118 can be a modified key to accommodate shortened key travel 148 and provide the height needed for thermal cooling device 154. While user experience may be impacted by shortened key travel 148, second key 118 with shortened key travel 148 may be a seldom used key or keys so the overall user experience is not greatly impacted. For example, second key 118 may be a function key, number key, or some other type of key that is not frequently used by users.

Figure 6:
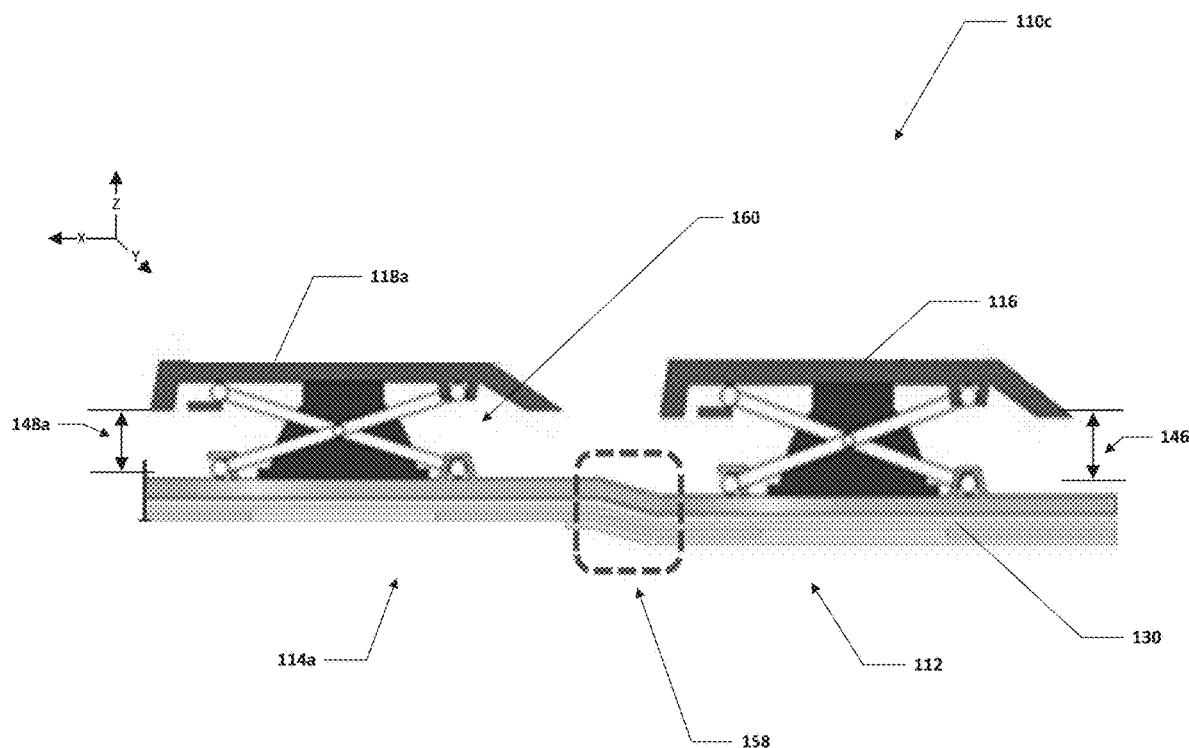
FIG. 6 is a simplified block diagram of a partial view of a system that includes a hybrid keyboard, in accordance with an embodiment of the present disclosure.

Turning to FIG. 6, FIG. 6 is a simplified block diagram of a cut-away partial side view of a portion of a keyboard 110c. Keyboard 110c can include first portion of keys 112 and second portion of keys 114a. First portion of keys 112 can include plurality of first keys 116. Each of plurality of first keys 116 can be a mechanical key that has a first key travel 146. Second portion of keys 114a can include plurality of second keys 118a. Each of plurality of second keys 118a can be keys that have a shortened key travel 148a, where shortened key travel 148a is less than first key travel 146. For example, each of plurality of second keys 118a may be low travel keys, touch keys, or some other type of key that has a relatively low key travel. Support plate 130 can be bent or curved at transition area 158 where first portion of keys 112 transitions to second portion of keys 114a. Each of plurality of second keys 118a can have a low travel key mechanism 160. Low travel key mechanism 160 can be a mechanical low travel key mechanism or some other mechanism that allows for a mechanical key to have a relatively low travel. While user experience may be impacted by shortened key travel 148, second key 118a with shortened key travel 148a may be a seldom used key or keys so the overall user experience is not greatly impacted. For example, second key 118a may be a function key, number key, or some other type of key that is not frequently used by users.

Figure 7:
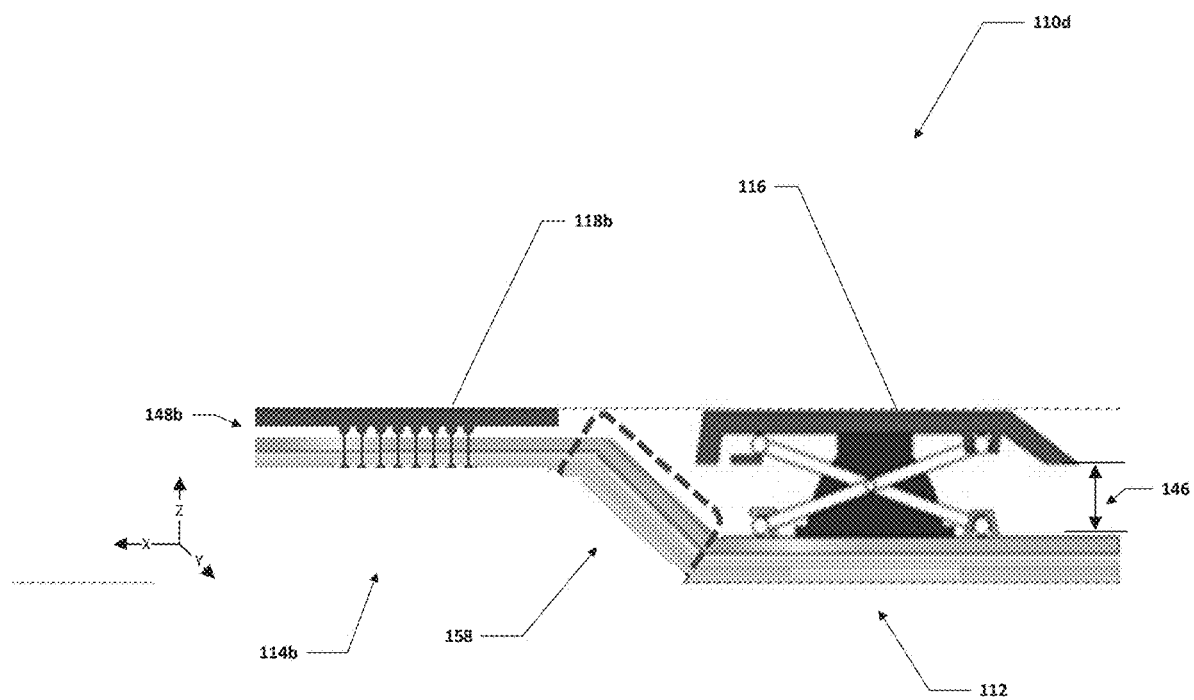
FIG. 7 is a simplified block diagram of a partial view of a system that includes a hybrid keyboard, in accordance with an embodiment of the present disclosure.

Turning to FIG. 7, FIG. 7 is a simplified block diagram of a cut-away partial side view of a portion of a keyboard 110d. Keyboard 110d can include first portion of keys 112 and second portion of keys 114b. First portion of keys 112 can include plurality of first keys 116. Each of plurality of first keys 116 can be a mechanical key that has a first key travel 146. Second portion of keys 114b can include plurality of second keys 118b. Each of plurality of second keys 118b can be keys that have a shortened key travel 148, where shortened key travel 148b is less than first key travel 146. For example, each of plurality of second keys 118b may be touch based keys or a key that does not travel or has a relatively very low key travel and registers a touch of a user for input. Support plate 130 can be bent or curved at transition area 158 where first portion of keys 112 transitions to second portion of keys 114b. While user experience may be impacted by the reduced key travel of shortened key travel 148b, second key 118b with shortened key travel 148 may be a seldom used key or keys so the overall user experience is not greatly impacted. For example, second key 118b may be a function key, number key, or some other type of key that is not frequently used by users.

Figure 8:
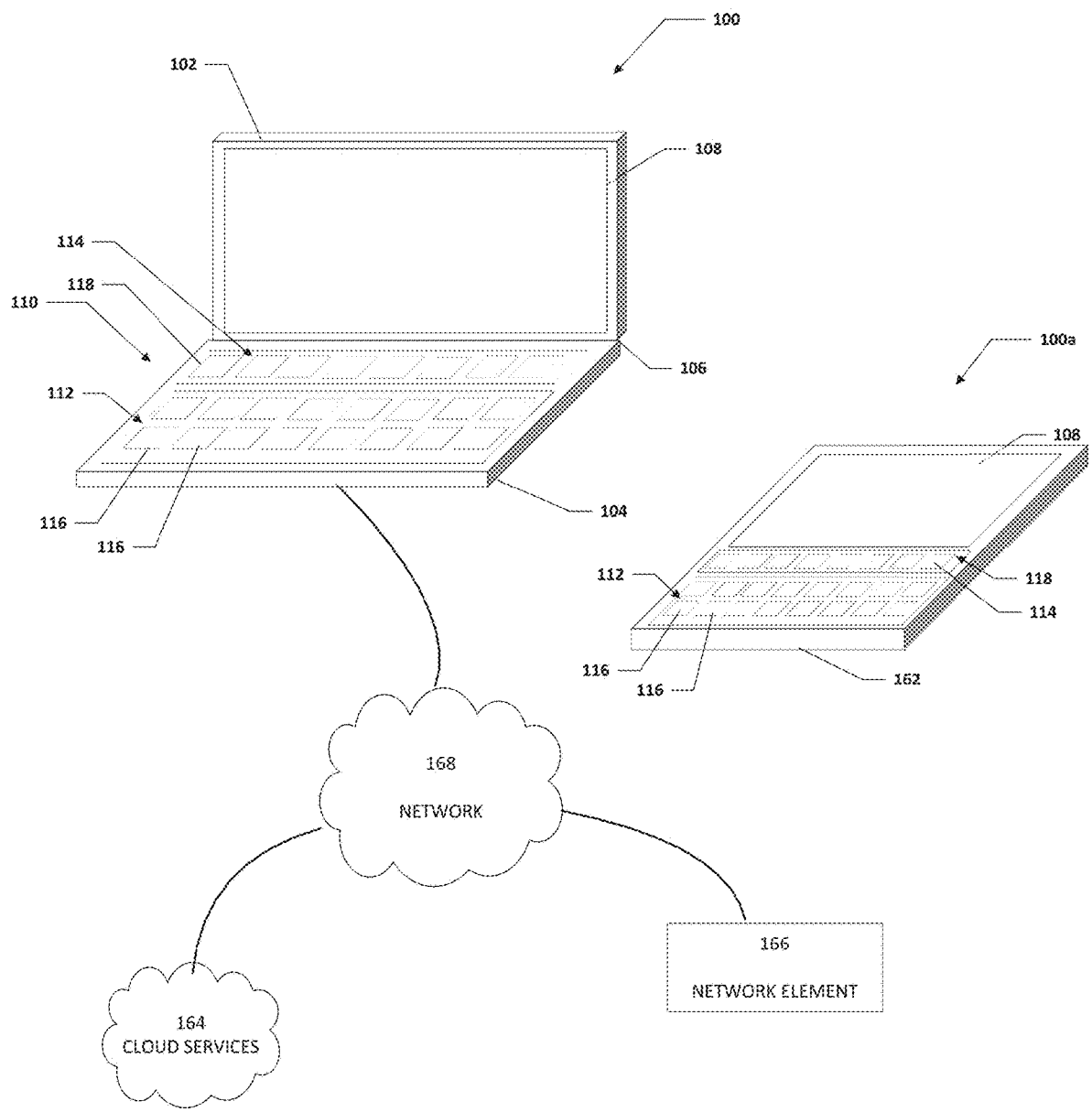
FIG. 8 is a simplified block diagram of a system that includes a hybrid keyboard, in accordance with an embodiment of the present disclosure.

Turning to FIG. 8, FIG. 8 is a simplified block diagram of electronic devices 100 and 100a configured with a hybrid keyboard design, in accordance with an embodiment of the present disclosure. In an example, electronic device 100 can include first housing 102 and second housing 104. First housing 102 can be rotatably coupled to second housing 104 using hinge 106. First housing 102 can include display 108.

Second housing 104 can include keyboard 110. Keyboard 110 can include first portion of keys 112 and second portion of keys 114. First portion of keys 112 can include plurality of first keys 116. Each of plurality of first keys 116 can be a mechanical key that has a first key travel. Second portion of keys 114 can include plurality of second keys 118. Each of plurality of second keys 118 can be keys that have a second key travel, where the second key travel is less than the first key travel. For example, each of plurality of second keys 118 may be low travel keys, touch keys, or some other type of key that has a relatively low key travel. The lower key travel of second keys 118 as compared to first keys 116 can help to increase the "Z" height under second portion of keys 114 and help to accommodate components, elements, etc. that would not be able to be accommodated under first portion of keys 112. In a specific example, a heat pipe under second portion of keys 114 can be thicker than a heat pipe under first portion of keys 112.

In an example, electronic device 100b can include housing 162. Housing 162 can include display 108 and keyboard 110. Keyboard 110 can include first portion of keys 112 and second portion of keys 114. First portion of keys 112 can include plurality of first keys 116. Each of plurality of first keys 116 can be a mechanical key that has a first key travel. Second portion of keys 114 can include plurality of second keys 118. Each of plurality of second keys 118 can be keys that have a second key travel, where the second key travel is less than the first key travel. For example, each of plurality of second keys 118 may be low travel keys, touch keys, or some other type of key that has a relatively low key travel. The lower key travel of second keys 118 as compared to first keys 116 can help to increase the "Z" height under second portion of keys 114 and help to accommodate components, elements, etc. that would not be able to be accommodated under first portion of keys 112. In a specific example, an additional heat pipe can be located under second portion of keys 114.

Electronic devices 100 and 100a may each be a standalone device or in communication with cloud services 164 and/or one or more network elements 166 using network 168. Network 168 represents a series of points or nodes of interconnected communication paths for receiving and transmitting packets of information. Network 168 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 168, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 100 and 100*a* have been illustrated with reference to particular elements and operations, these elements and operations may be replaced by any suitable architecture, protocols, and/or processes that achieve the intended functionality of electronic devices 100 and 100*a*.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, keyboard can include a first portion of keys with a first key travel, a second portion of keys with a second key travel, wherein the second key travel is less than the first key travel, and a support plate, wherein the support plate is raised under the second portion of keys and causes the second portion of keys to have the second key travel.

In Example A2, the subject matter of Example A1 can optionally include where the second portion of keys are low travel keys.

In Example A3, the subject matter of any one of Examples A1-A2 can optionally include where the second portion of keys are touch based keys.

In Example A4, the subject matter of any one of Examples A1-A3 can optionally include where the second portion of keys include function keys.

In Example A5, the subject matter of any one of Examples A1-A4 can optionally include where the second portion of keys include a row of function keys and a row of number keys.

Example AA1 is an electronic device including a heat source, a first heat pipe, a second heat pipe, and a keyboard. The keyboard includes a first portion of keys with a first key travel, a second portion of keys with a second key travel, wherein the second key travel is less than the first key travel, and a support plate, wherein the support plate is raised under the second portion of keys and causes the second portion of keys to have the second key travel, wherein the second heat pipe is located under the second portion of keys.

In Example AA2, the subject matter of Example AA1 can optionally include where the second portion of keys are low travel keys.

In Example AA3, the subject matter of any one of the Examples AA1-AA2 can optionally include where the second portion of keys are touch based keys.

In Example AA4, the subject matter of any one of the Examples AA1-AA3 can optionally include where the second portion of keys include function keys.

In Example AA5, the subject matter of any one of the Examples AA1-AA4 can optionally include where the second portion of keys include a row of function keys and a row of number keys.

In Example AA6, the subject matter of any one of the Examples AA1-AA5 can optionally include where the second heat pipe has a thickness that is larger than the thickness of the first heat pipe.

In Example AA7, the subject matter of any one of the Examples AA1-AA6 can optionally include where the electronic device is a clamshell computer.

Example M1 is a method including modifying a keyboard, wherein the modified keyboard includes a first portion of keys with a first key travel, a second portion of keys with a second key travel, wherein the first key travel is longer than the second key travel, and a support plate, wherein the support plate is raised under the second portion of keys and causes the second portion of keys to have the second key travel. The method also includes positioning a component under the second portion of keys.

In Example M2, the subject matter of Example M1 can optionally include where the component is a heat pipe.

In Example M3, the subject matter of any one of the Examples M1-M2 can optionally include where the heat pipe has a larger thickness than a different heat pipe located under the first portion of keys.

In Example M4, the subject matter of any one of the Examples M1-M3 can optionally include where the component is thermal cooling device.

In Example M5, the subject matter of any one of the Examples M1-M4 can optionally include where the second portion of keys are low travel keys.

In Example M6, the subject matter of any one of the Examples M1-M5 can optionally include where the second portion of keys are touch based keys.

In Example M7, the subject matter of any one of the Examples M1-M6 can optionally include where the second portion of keys include function keys.

In Example M8, the subject matter of any one of the Examples M1-M7 can optionally include where the second portion of keys include a row of function keys and a row of number keys.

Example AAA1 is an apparatus including means for modifying a keyboard, wherein the modified keyboard includes a first portion of keys with a first key travel, a second portion of keys with a second key travel, wherein the first key travel is longer than the second key travel, and a support plate, wherein the support plate is raised under the second portion of keys and causes the second portion of keys to have the second key travel, and means for positioning a component under the second portion of keys.

In Example AAA2, the subject matter of Example AAA1 can optionally include where the component is a heat pipe.

In Example AAA3, the subject matter of any one of Examples AAA1-AAA2 can optionally include where the heat pipe has a larger thickness than a different heat pipe located under the first portion of keys.

In Example AAA4, the subject matter of any one of Examples AAA1-AAA3 can optionally include where the component is thermal cooling device.

In Example AAA5, the subject matter of any one of Examples AAA1-AAA4 can optionally include where the second portion of keys are low travel keys.

In Example AAA6, the subject matter of any one of Examples AAA1-AAA5 can optionally include where the second portion of keys are touch based keys.

In Example AAA1, the subject matter of any one of Examples AAA1-AAA6 can optionally include where the second portion of keys include function keys.

In Example AAA8, the subject matter of any one of Examples AAA1-AAA7 can optionally include where the second portion of keys include a row of function keys and a row of number keys.

What is claimed is:

1. A keyboard comprising:
   a first portion of keys with a first key travel;
   a second portion of keys with a second key travel, wherein the second key travel is less than the first key travel; and
   a support plate that extends from the first portion of keys to the second portion of keys, wherein the support plate is raised under the second portion of keys and causes the second portion of keys to have the second key travel, wherein the support plate has an incline profile at a transition area where the first portion of keys transitions to the second portion of keys.

2. The keyboard of claim 1, wherein the second portion of keys are low travel keys.

3. The keyboard of claim 1, wherein the second portion of keys are touch based keys.

4. The keyboard of claim 1, wherein the second portion of keys include function keys.

5. The keyboard of claim 1, wherein the second portion of keys include a row of function keys and a row of number keys.

6. An electronic device comprising:
   a heat source;
   a first heat pipe;
   a second heat pipe; and
   a keyboard, wherein the keyboard includes:
   a first portion of keys with a first key travel, wherein a first portion of the first heat pipe is located under the first portion of keys;
   a second portion of keys with a second key travel, wherein the second key travel is less than the first key travel, wherein a second portion of the first heat pipe and the second heat pipe is located under the second portion of keys and the second heat pipe is over the first heat pipe; and
   a support plate that extends from the first portion of keys to the second portion of keys, wherein the support plate is raised under the second portion of keys and causes the second portion of keys to have the second key travel, wherein the support plate has an incline profile at a transition area where the first portion of keys transitions to the second portion of keys.

7. The electronic device of claim 6, wherein the second portion of keys are low travel keys.

8. The electronic device of claim 6, wherein the second portion of keys are touch based keys.

9. The electronic device of claim 6, wherein the second portion of keys include function keys.

10. The electronic device of claim 6, wherein the second portion of keys include a row of function keys and a row of number keys.

11. The electronic device of claim 6, wherein the second heat pipe has a thickness that is larger than the thickness of the first heat pipe.

12. The electronic device of claim 6, wherein the electronic device is a clamshell computer.

13. A method comprising:
    modifying a keyboard, wherein the modified keyboard includes:
    a first portion of keys with a first key travel;
    a second portion of keys with a second key travel, wherein the first key travel is longer than the second key travel; and
    a support plate that extends from the first portion of keys to the second portion of keys, wherein the support plate is raised under the second portion of keys and causes the second portion of keys to have the second key travel, wherein the support plate has an incline profile at a transition area where the first portion of keys transitions to the second portion of keys; and
    positioning a component under the second portion of keys.

14. The method of claim 13, wherein the component is a heat pipe.

15. The method of claim 14, wherein the heat pipe has a larger thickness than a different heat pipe located under the first portion of keys.

16. The method of claim 13, wherein the component is thermal cooling device.

17. The method of claim 13, wherein the second portion of keys are low travel keys.

18. The method of claim 13, wherein the second portion of keys are touch based keys.

19. The method of claim 13, wherein the second portion of keys include function keys.

20. The method of claim 13, wherein the second portion of keys include a row of function keys and a row of number keys.

* * * * *